(12) United States Patent
Brueck et al.

(10) Patent No.: US 10,141,418 B1
(45) Date of Patent: Nov. 27, 2018

(54) DEVICE WITH HETEROEPITAXIAL STRUCTURE MADE USING A GROWTH MASK

(71) Applicants: Steven R. J. Brueck, Albuquerque, NM (US); Stephen D. Hersee, Cudjoe Key, FL (US); Seung-Chang Lee, Albuquerque, NM (US); Daniel Feezell, Albuquerque, NM (US)

(72) Inventors: Steven R. J. Brueck, Albuquerque, NM (US); Stephen D. Hersee, Cudjoe Key, FL (US); Seung-Chang Lee, Albuquerque, NM (US); Daniel Feezell, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 39 days.

(21) Appl. No.: 14/830,241

(22) Filed: Aug. 19, 2015

Related U.S. Application Data

(62) Division of application No. 13/944,808, filed on Jul. 17, 2013, now Pat. No. 9,142,400.
(Continued)

(51) Int. Cl.
| | |
|---|---|
| *H01L 29/06* | (2006.01) |
| *H01L 29/66* | (2006.01) |
| *H01L 29/78* | (2006.01) |
| *H01L 29/20* | (2006.01) |
| *H01L 29/16* | (2006.01) |

(Continued)

(52) U.S. Cl.
CPC .. *H01L 29/66462* (2013.01); *H01L 21/02381* (2013.01); *H01L 29/04* (2013.01); *H01L 29/0676* (2013.01); *H01L 29/16* (2013.01); *H01L 29/20* (2013.01);
(Continued)

(58) Field of Classification Search
CPC ......... H01L 21/02107; H01L 21/02381; H01L 21/02532; H01L 21/02538; H01L 21/02639; H01L 27/1211; H01L 29/0665; H01L 29/0673; H01L 29/0676;
(Continued)

(56) References Cited

U.S. PATENT DOCUMENTS

| | | | |
|---|---|---|---|
| 8,188,513 B2 | 5/2012 | Hersee et al. | |
| 8,324,660 B2 | 12/2012 | Lochtefeld et al. | |

(Continued)

FOREIGN PATENT DOCUMENTS

WO 2011-135432 A1 11/2011

OTHER PUBLICATIONS

Rahman, A. Novel channel materials for ballistic nanoscals MOSFETs—bandstructure effects. IEDM, 2005, pp. 1-4.
(Continued)

*Primary Examiner* — Peter Bradford
(74) *Attorney, Agent, or Firm* — MH2 Technology Law Group LLP (57) ABSTRACT

A method for making a heteroepitaxial layer. The method comprises providing a semiconductor substrate. A seed area delineated with a selective growth mask is formed on the semiconductor substrate. The seed area comprises a first material and has a linear surface dimension of less than 100 nm. A heteroepitaxial layer is grown on the seed area, the heteroepitaxial layer comprising a second material that is different from the first material. Devices made by the method are also disclosed.

5 Claims, 11 Drawing Sheets

Related U.S. Application Data (60) Provisional application No. 61/672,713, filed on Jul. 17, 2012.

(51) Int. Cl.
   *H01L 29/04* (2006.01)
   *H01L 21/02* (2006.01)

(52) U.S. Cl.
   CPC .. *H01L 29/66666* (2013.01); *H01L 29/66795* (2013.01); *H01L 29/7827* (2013.01); *H01L 29/7851* (2013.01)

(58) Field of Classification Search
   CPC ............. H01L 29/66469; H01L 29/775; H01L 29/7783; H01L 29/045; B82Y 10/00; B82Y 40/00
   See application file for complete search history.

(56) References Cited

U.S. PATENT DOCUMENTS

| | | | |
|---|---|---|---|
| 8,330,143 B2 | 12/2012 | Wernersson et al. | |
| 2003/0089899 A1 | 5/2003 | Lieber et al. | |
| 2006/0207647 A1* | 9/2006 | Tsakalakos | B82Y 20/00 136/256 |
| 2008/0149944 A1* | 6/2008 | Samuelson | B82Y 10/00 257/88 |
| 2009/0039361 A1* | 2/2009 | Li | H01L 21/02381 257/94 |
| 2009/0223558 A1* | 9/2009 | Sun | H01L 31/02242 136/255 |
| 2011/0031470 A1* | 2/2011 | Scherer | B82Y 10/00 257/9 |
| 2011/0042744 A1* | 2/2011 | Cheng | H01L 29/66795 257/347 |
| 2011/0100411 A1 | 5/2011 | Lagally et al. | |
| 2011/0101456 A1* | 5/2011 | Hoentschel | H01L 29/045 257/347 |
| 2011/0140085 A1* | 6/2011 | Homyk | B82Y 10/00 257/24 |
| 2011/0169012 A1* | 7/2011 | Hersee | B82Y 10/00 257/76 |
| 2012/0091465 A1* | 4/2012 | Krames | B82Y 10/00 257/79 |
| 2013/0037857 A1* | 2/2013 | Von Kanel | H01L 21/0237 257/190 |
| 2013/0161756 A1* | 6/2013 | Glass | H01L 29/66545 257/369 |
| 2014/0264488 A1* | 9/2014 | Fronheiser | H01L 29/66795 257/288 |
| 2015/0014631 A1* | 1/2015 | Ohlsson | H01L 21/0237 257/24 |

OTHER PUBLICATIONS

Datta, S. 85nm Gate Length Enhancement and Depletion mode InSb Quantum Well Transistors for Ultra High Speed and Very Low Power Digital Logic Applications. IEDM, 2005, pp. 1-4.
Iwai, H. Recent Status on Nano CMOS and Future Direction. Intl. Conf. on Nano-CMOS, IEEE, 2006, pp. 1-5.
Brammertz, G. et al. Selective epitaxial, growth of GaAs on Ge by MOCVD, Journal of Crystal Growth, 2006, vol. 297, pp. 204-210.
Datta, S. Ultrahigh-Speed 0.5 V Supply Voltage In0.7Ga0.3As Quantum-Well Transistors on Silicon Substrate. IEEE Electron Device Letters, Aug. 2007. vol. 28, No. 8, pp. 685-687.
Do, Q.-T. et al. High Transconductance MISFET with a Single InAs Nanowire Channel, IEEE Electron Device Letters, Aug. 2007, vol. 28, No. 8, pp. 682-684.
Park, J.-S. et al. Defect reduction of selective Ge epitaxy in trenches on Si (001) substrates using aspect ratio trapping. Applied Physics Letters 90, 2007, pp. 052113/1-052113/3.
Ashley, T. et al, Heterogeneous InSb quantum well transistors on silicon for ultra-high speed, low power logic applications. Electronics Letters, Jul. 5, 2007, vol. 43, No. 14, 2 Pages.
Bourianoff, G. I. et al. Research directions in beyond CMOS computing. Solid-State Electronics, 2007, vol. 51, pp. 1426-1431.
Hu, Y. et al. Sub-100 Nanometer Channel Length Ge/Si Nanowire Transistors with Potential for 2 THz Switching Speed, Nano Letters, 2008, vol. 8, No. 3, pp. 925-930.
Antoniadis, D. A. et al. MOSFET Performance Scaling: Limitations and Future Options, IEDM, 2008, 4 Pages.
Verhulst, A. S. et al. Complementary Silicon-Based Heterostructure Tunnel-FETs With High Tunnel Rates. IEEE Electron Device Letters, 2008, vol. 29, pp. 1-4.
Mookerjea, S. et al. Comparative Study of Si, Ge and InAs based Steep SubThreshold Slope Tunnel Transistors for 0.25V Supply Voltage Logic Applications, Proc DRC, 2008, 2 Pages.
Wu, Y. Q. et al. 0.8-V Supply Voltage Deep-Submicrometer Inversion-Mode In0.75Ga0.25As MOSFET, IEEE Electron Device Letters, Jul. 2009, vol. 30, No. 7, pp. 700-702.
Wang, G. et al, High quality Ge epitaxial layers in narrow channels on Si (001) substrates. Applied Physics Letters, vol. 96, 2010, pp. 111903/1-111903/3.
Doornbos, G. et al. Benchmarking of III-V n-MOSFET Maturity and Feasibility for Future CMOS. IEEE Electron Device Letters, Oct. 2010, vol. 31, No. 10, pp. 1110-1112.
Lubow, A. et al. Comparison of drive currents in metal-oxide-semiconductor field-effect transistors made of Si, Ge, GaAs, InGaAs, and InAs channels. Applied Physics Letters, 2010, vol. 96, pp. 122105/1-122105/3.
Moutanabbir, O. et al. Heterogeneous Integration of Compound Semiconductors. Annu. Rev. Mater. Res., 2010, vol. 40. pp. 469-500.
Wang, G. et a. Fabrication of high quality Ge virtual substrates by selective epitaxial growth in shallow trench isolated Si (001) trenches, Thin Solid Films, 2010, vol. 518, pp. 2538-2541.
Keshavarzi, A. et al, Architecting Advanced Technologies for 14nm and Beyond with 3D FinFET Transistors for the Future SoC Applications. Proc. IEDM, 2011, pp. 4.1.1-4.1.4.
Ali, A. et al. Advanced Composite High-K Gate Stack for mixed Anion Arsenide-Antimonide Quantum Well Transistors. Proc IEDM, 2010, 5 Pages.
Bessire, C. D. et al. Trap-Assisted Tunneling in Si—InAs Nanowire Heterojunction Tunnel Diodes. Nano Letters, 2011, vol. 11. pp. A-E.
Heyns, M. et al, Advancing CMOS beyond the Si roadmap with Ge and III/V devices. Proc IEDM, 2011; pp. 13.1.1-13.1.4.
Kim, S-H. et al. Electron Mobility Enhancement of Extremely Thin Body In0:7Ga0:3As-on-Insulator Metal-Oxide-Semiconductor Field-Effect Transistors on Si Substrates by Metal-Oxide-Semiconductor Interface Buffer Layers. Applled Physics Express, 2012, vol. 5, pp. 014201/1-014201-3.
Tomioka, K et al. A III-V nanowire channel on silicon for high-Performance vertical transistors. Nature, Aug. 9, 2012, vol. 488, pp. 189-193.
Takei, K. et al. Nanoscale InGaSb Heterostructure Membranes on Si Substrates for High Hole Mobility Transistors. Nano Letters, 2012, vol. 12, pp. 2060-2066.
Hwang, E. et al. Investigation of scalability of In0.7Ga0.3As quantum well field effect transistor (QWFET) architecture for logic applications. Solid-State Electronics, 2011, pp. 1-8.
Long, Wei et al. Dual-Material Gate (DMG) Field Effect Transistor. IEEE Transactions on Electron Devices, May 1999, vol. 46, No. 5, pp. 865-870.
Larrieu, G. et al. Vertical nanowire array-based field effect transistors for ultimate scaling. Nanoscale, 2013(5): 2437-2441.
Brammertz, G. et al. GaAs on Ge for CMOS. Thin Solid Films, 2008(517):148-151.
Hsu, Chao-Wei et al. Dislocation reduction of InAs nanofins prepared on Si substrate using metal-organic vapor-phase epitaxy, Nanoscale Research Letters, 2012(7):1-4.
Dutta et al., "Novel Properties of Graphene Nanoribbons: A Review," J. Mater. Chem., 2010, 20, 8207-8223.

* cited by examiner

DEVICE WITH HETEROEPITAXIAL STRUCTURE MADE USING A GROWTH MASK

RELATED APPLICATIONS

This application is a divisional of U.S. patent application Ser. No. 13/944,808, filed Jul. 17, 2013, which claims priority under 35 U.S.C. 119 to provisional application No. 61/672,713 filed Jul. 17, 2012, both of which are herein incorporated by reference in their entirety.

FEDERALLY SPONSERED RESEARCH

This invention was made with government support under Contract No. EEC-0812056 awarded by the National Science Foundation (NSF) and/or contract No. HDTRA1-11-1-0021 awarded by DTRA. The U.S. Government has certain rights in this invention.

FIELD OF THE DISCLOSURE

The present disclosure s directed to a method for remaking a heteroepitaxial structure and devices formed by the method.

BACKGROUND

The integrated circuit industry has a long history of "Moore's law" scaling of silicon transistors from dimensions of over 10 microns to today's 22 nm generation. In the current 22 nm generation the industry has moved to a FinFET or tri-gate structure in which the gate is wrapped around three sides of the silicon channel to provide improved electrostatic control of the carriers.

While further scaling is proceeding, the channel in the latest Intel tri-gate transistor is only about 20 atoms wide, so the end to scaling is clearly on the horizon. The industry has identified several directions for continuing the evolution of CMOS circuits. One direction that is being actively investigated is the use of higher mobility materials such as III-V semiconductors, III-N materialsand Ge for the transistor channel. Another alternative is the use of vertical transistors with wrap-around (gate all around) geometries again all of the same material classes are being investigated.

This evolution to heterostructure transistor structures requires new manufacturing approaches. Two principle directions are being investigated: wafer bonding; and heterostructure materials growth. in wafer bonding, the non-silicon materials are grown on their conventional substrates with the inclusion of a separation layer. Following the growth, the epitaxial material is bonded to a silicon wafer and selective etching is used to separate the original substrate. Films of only a few nm thickness have been transferred with this approach. Since the non-silicon material is grown using well established technologies, the issues of lattice etch and defects are largely controlled, However, this is a complex technology and is far from manufacturing worthy for the large area silicon substrates (today 300 nm diameter migrating to 450 nm diameter) used by the silicon integrated circuit industry. Thermal expansion mismatch issues (the expansion coefficients of the III-V materials and the Si substrate are different) remain.

Heteroepitaxial growth of different semiconductor and dielectric materials directly on Si(001) is another approach. The main issues are defect associated with the lattice and thermal expansion mismatches between the foreign material and the Si. For large area growths, these issues give rise to dislocations and can cause cracking of the foreign film. Traditionally a thick buffer layer is grown to mitigate these effects and reduce the defects between the substrate and the active layer. While there has been some success with this approach, it is not compatible with integration on the very small scales of today's silicon integrated circuits.

SUMMARY

An embodiment of the present disclosure is directed to a method for making a heteroepitaxial layer. The method comprises providing a semiconductor substrate. A seed area delineated with a selective growth mask is formed on the semiconductor substrate. The seed area comprises a first material and has a linear surface dimension of less than 100 nm. A heteroepitaxial layer is grown on the seed area, the heteroepitaxial layer comprising a second material that is different from the first material.

Another embodiment of the present disclosure is directed to a device. The device comprises a semiconductor substrate and a seed area delineated with a selective growth mask on the semiconductor substrate. The seed area comprises a first material and a linear surface dimension of less than 100. A heteroepitaxial layer is grown on the seed area, the heteroepitaxial layer comprising a second material that is different from the first material.

Another embodiment of the present disclosure is directed to a method for making a heteroepitaxial layer. The method comprises providing a semiconductor substrate. A nanostructured pedestal is formed on the semiconductor substrate, the pedestal having a top surface and a side surface. The top surface forms a seed area having a linear surface dimension that ranges from about 10 nm to about 100 nm. A selective growth mask layer is provided on the top surface and side surface of the pedestal. A portion of the selective growth mask layer is removed to expose the seed area of the pedestal. An epitaxial layer is grown on the seed area.

Still another embodiment of the present disclosure is directed to a heteroepitaxial nanostructure. The heteroepitaxial nanostructure comprises a substrate. A pedestal is formed on the substrate, the pedestal having a top surface and a side surface. The top surface comprises a seed area. A heteroepitaxial layer is grown on the seed area of the pedestal, the seed area having a linear surface dimension that ranges from about 10 nm to about 100 nm.

It is to be understood that both the foregoing general description and the following detailed description are exemplary and explanatory only and are not restrictive of the present teachings, as claimed.

BRIEF DESCRIPTION OF THE DRAWINGS

The accompanying drawing, which is incorporated in and constitutes a part of this specification, illustrates an embodiment of the present teachings and together with the description, serves to explain the principles of the present teachings.

It should be noted that some details of the figure have been simplified and are raw to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawing. In the drawings, like reference numerals have been used throughout to designate identical elements. In the following description, reference is made to the accompanying drawing that forms a part thereof, and in which is shown by way of illustration specific exemplary embodiment in which the present teachings may be practiced. The following description is, therefore, merely exemplary.

The present application is directed to devices and methods for forming devices in which a seed area for heteroepitaxial growth is formed on a semiconductor substrate. The seed area comprises a two-dimensional area with at least one dimension less than about 100 nm. In an embodiment, the seed area comprises a linear surface dimension that ranges from about 10 nm to about 100 nm, such as about 10 nm to about 50 nm. In another embodiment, seed areas having deteroepitaxial structures with linear surface dimensions less than 20 or 25 nm can be employed. A heteroepitaxial layer comprising a second material that is different from the first material can be grown using the seed area to nucleate the epitaxial growth. In this application, the term "linear surface dimension" can refer to any linear dimension of the surface of the seed area, such as, for example, a width or diameter.

Employing seed areas having relatively small dimensions in the manner disclosed herein can have one or more of the following benefits: the ability to form heteroepitaxial structures with reduced numbers of defects compared with larger area heteroepitaxial layers; the ability to form heteroepitaxial structures with zero or substantially zero defects; the ability to form heteroepitaxial pillar structures that are flexible and/or that can accommodate strain better than heteroepitaxial layers grown on a planar substrate surface; or the ability to form small area heteroepitaxial films that can accommodate strain better than heteroepitaxial layers grown on a large area of a substrate surface.

The nanoscale heteroepitaxial growth of the present disclosure can exploit the greatly improved materials quality that occurs when the substrate, such as, for example a silicon fin, is nanoscale in lateral size. Thus by using nanoscale heteroepitaxial growth onto, for example, a 10 nm wide silicon area, which is already only ~20 atoms wide, the heteroepitaxial techniques and devices of the present disclosure can take advantage of the evolution of integrated circuits. When the dimensions of a growth area are reduced to below the average scale to nucleate a defect such as a threading dislocation, it is possible to grow heterogeneous materials without nucleating either threading dislocations or antisite defects (boundaries where two grains of the zinc-blende III-V crystal are misoriented by 180°. The scale for this defect free growth is that at least one linear dimension of the growth area be much less than the mean distance between defects in a large area heteroepitaxial growth. In an embodiment, dimensions of about 100 nm or less can be employed, such as, for example, about 10 to about 20 nm. The table below gives some typical dislocation densities and the corresponding average distance between dislocations. Note that to be suitable for silicon electronics, the incidence of threading dislocations that impact the electrical properties of an individual channel can be exceedingly low. Today's microprocessors contain as many as 3,000,000,000 transistors, and perhaps as many as 30,000,000,000 channels. With continued Moore's law scaling, this number will continue to climb exponentially. The allowed number of defected channels can be a very small fraction of the total number of channels.

| Material/Substrate | Typical Threading Dislocation Density ($cm^{-2}$) | Average Distance between Dislocations (μm) |
|---|---|---|
| $Ge_{0.23}Si_{0.77}$/Si(001) | $5 \times 10^5$ | 14 |
| GaAs/Si(001) | $1 \times 10^5$ | 3.2 |
| GaAs/GaAs | $1 \times 10^4$ | 100 |
| InAs/Si(001) | $1 \times 10^7$ | 3.2 |
| GaN/sapphire | $1 \times 10^9$ | 0.32 |
| GaN/SiC | $5 \times 10^8$ | 0.45 |
| GaN/GaN | $1 \times 10^6$ | 1 |
| GaN/Si(111) | $1 \times 10^{10}$ | 0.1 |

The prospects for defect-free nanoscale growth are further improved by the migration of silicon integrated circuits to FinFET architectures. In contrast to the growth in a simple opening atop a bulk substrate, the FinFET pedestal is significantly more compliant, e.g. it can share the strain (lattice displacement) associated with the lattice mismatch stress with the growing film. Control of strain in MOSFET channels is an important aspect of modern integrated circuit manufacturing since the strain directly impacts the electronic properties of the material. Nanoscale growth provides additional approaches to controlling this strain in the FinFET channel by adjusting the dimensions of the "fin" and the thickness and layer structure of the grown material.

FIG. 1A-E illustrate a method for making a heteroepitaxial layer, according to an embodiment of the present disclosure. The method comprises providing a substrate 10. Examples of suitable substrates include on wafers, silicon-on-insulator substrates, or other materials used as semiconductor substrates. Suitable substrates are commercially available and are well known in the art. In an embodiment, the semiconductor substrate comprises silicon having a (001) facet exposed for processing, As an example, the cross-sections of substrate 10 shown in the figures herein can have the <110> direction oriented into the paper.

Figure 1A:
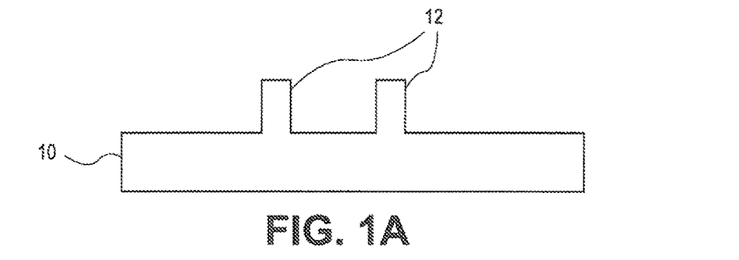
FIGS. 1A-E illustrate a method for making a heteroepitaxial layer, according to an embodiment of the present disclosure.

Nanostructured pedestals 12 are formed on the substrate. The Nanostructured pedestals 12 are comprised of any suitable material capable of acting as a seed layer for subsequent epitaxial growth. Examples of suitable materials include doped or undoped single crystal silicon, Other suitable materials include single crystal III-V materials, such as GaAs and GaSb, which are common substrate materials in photonics and high-speed electronics; and single crystal GaN, sapphire and SiC. Any other single crystal material that provides a suitable nucleation surface for the desired epitaxial growth can be employed, In an embodiment, the pedestals 12 can be formed from the same material as the substrate, where the substrate is a single crystal material., In other embodiments, the pedestals can be a different material form the substrate. Any desired technique for forming the single crystal pedestals can be used. Examples of such techniques include various methods for patterning and etching the substrate surface. Suitable techniques are well known in the art. For purposes of strain relief as discussed below, it is useful to have the pedestals roughly as high or higher as the smallest in-plane dimension of the seed area.

Figure 1B:
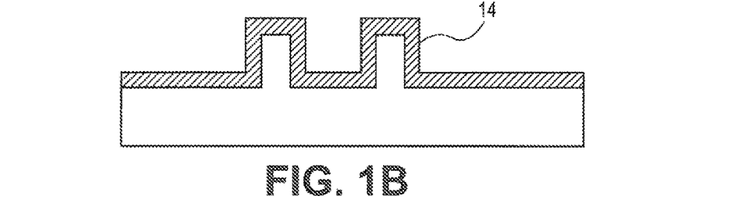

Referring to FIG. 1B, a selective growth mask layer 14 is provided on a top surface and side surface of the pedestal. In an embodiment, the selective growth mask layer 14 can be provided over the entire perimeter of the sidewall surface. In an embodiment, selective growth mask layer 14 is formed on at least three sides of the pedestal, including the top surface and front and back sidewalls of a pedestal. Any suitable technique for forming the selective growth mask layer, such as oxidation of the semiconductor substrate surface, or deposition of material onto the surface, can be employed. Suitable methods for forming selective growth masks are well known in the art.

Figure 1C:
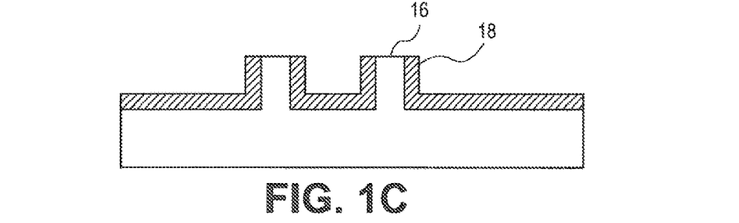

Referring to FIG. 1C, a portion of the selective growth mask layer 14 is removed to expose at least the top surface 16 of the pedestal 12. Various suitable methods can be employed to selectively remove the top portion of selective growth mask layer 14. Examples include anisotropically etching to selectively remove the selective growth mask layer from the top surface of the pedestal; or formation of a non-conformal layer, such as by depositing and reflowing a layer followed by an etch back process. The etch back process can employ polishing, such as chemical mechanical polishing. Yet other examples of techniques for removing a portion of selective growth mask layer 14 will be discussed in greater detail below with respect to the method of FIG. 2.

Figure 1D:
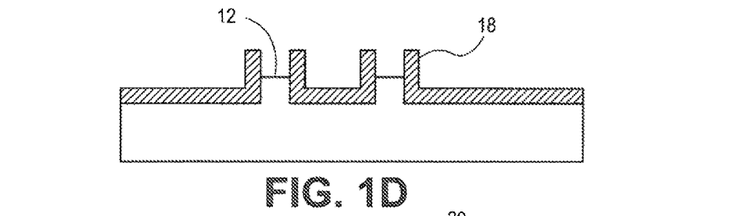

After exposing the top surface of the pedestals 12, the semiconductor material of pedestal 12 can optionally be selectively etched back, as shown in FIG. 1D As a result of the selective etch back, remaining portions of the selective growth mask layer 14 form sidewall barriers 18. The side wall barriers 18 can act to block defects, such as stacking faults that propagate, for example, along (111) directions (e.g., at an angle to the top surface).

Any suitable process for selectively etching back the pedestal 12 can be employed. Suitable etch back processes are well known in the art. In an embodiment, the remaining portion of pedestal 12 comprises a (001) facet of silicon material exposed at the pedestal top surface.

Following the selective etch back, an epitaxial layer is grown on the remaining portion of pedestal 12. The exposed top surface of pedestal 12 provides a seed area for the epitaxial growth. As described above, the seed area can have at least one dimension that is less than about 100 nm. Example configurations for the seed area include a rectangular area having with a width dimension ranging from about 10 nm to about 100 nm and a length dimension ranging from about 200 nm to about 2000 nm; or a circular area having a diameter ranging from, for example, about 10 nm to about 100 nm.

In an embodiment, the heteroepitaxial layer comprises a Group III-V semiconductor material. Examples of Group III-V semiconductor materials include nitrogen-based materials, such as gallium nitride or other Group III-N semiconductors, such as AlGaN, indium nitride (InN), and indium gallium nitride ($In_xGa_{1-x}N$). Other examples of Group III-V semiconductor materials include InAs and InAsSb, which have significantly higher electron mobilities and saturation velocities in comparison with Si. The techniques described also apply to semiconductor materials other than III-V materials, such as Ge.

The growth of the epitaxial layer is directed by the seed area of the nanostructured pedestal surface. Epitaxial growth copies the underlying crystal structure of the substrate, e.g., atoms line up as if they are a continuation of the starting crystal structure. In the case of heteroepitaxial growth, the grown film might have the same symmetry as the seed area, but a different natural distance between atoms (this is the lattice mismatch mentionedmismatch above).

Figure 1E:
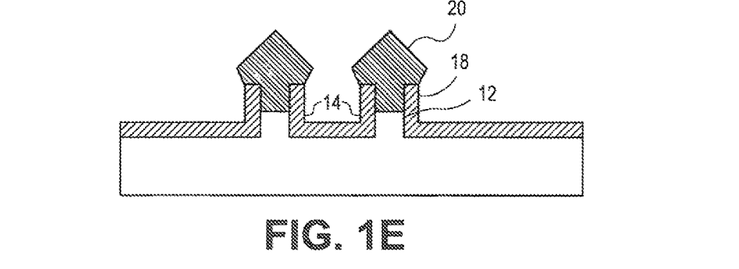

FIG. 1E illustrates an example of a heteroepitaxial nanostructure. The nanostructure comprises the remaining pedestal 12 having a nano-dimensional top surface and a side surface; and the epitaxial layer 20 grown on the nano-dimensional top surface of the pedestal. In an embodiment, the remaining selective growth mask layer 14 extends above the surface of the pedestal 12 to form sidewall barriers 18. The epitaxial layer 20 can grow between and above the sidewall barriers 18, at which point the width dimensions of the heteroepitaxial layer nanostructure may increase to overlap the insulator, as shown, for example, in FIG. 1E. Additional growth can result in further enlargement of the heteroepitaxial layer as desired.

Figure 2A:
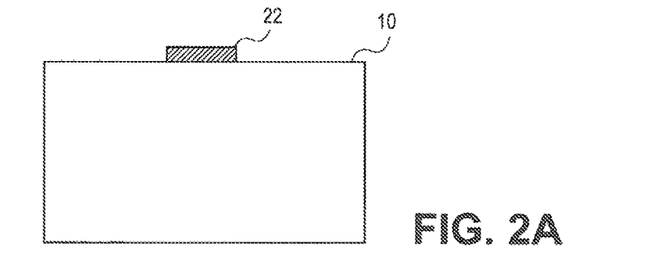
FIGS. 2A-2F illustrate a method for making, heteroepitaxial layers, according to another embodiment of the present disclosure.

FIGS. 2A-2F illustrate a method for making heteroepitaxial layers, according to another embodiment of the present disclosure. As illustrated in FIG. 2A, the substrate 10 is a silicon substrate. Pedestals 12 are formed by employing an etch mask 22. The etch mask can have width or diameter dimensions of about 1 micron or less. FIG. 3 illustrates a top view, showing the etch mask 22 used to pattern the substrate. However, any other suitable shaped pattern can be employed, such as masks for forming square or rectangle features. The etch mask 22 can be any suitable mask type, such as a patterned photoresist layer or hard mask formed of, for example, silicon oxide.

Figure 2B:
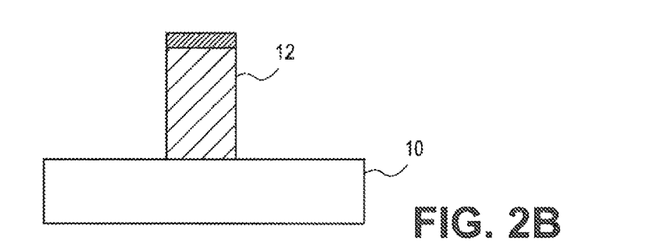
Figure 2C:
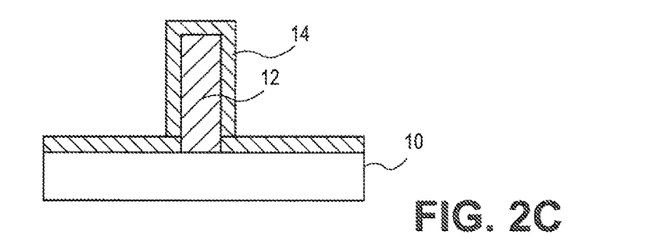
Figure 3:
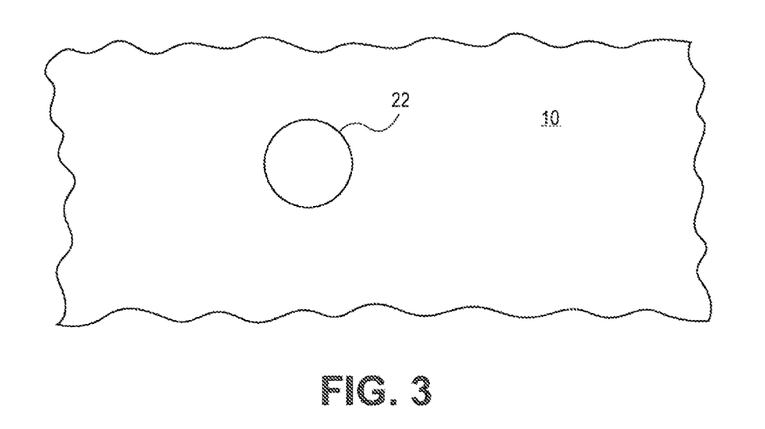
FIG. 3 illustrates a top view of a mask employed in an embodiment of the present disclosure.

Using the etch mask 22, the silicon substrate can be patterned by etching to form the pedestal 12, as illustrated in FIG. 2B. Any suitable etching process can be employed that will form the desired pedestal shape. In an embodiment, a dry etching process is employed.

Following etching, the etch mask 22 can be removed. In an embodiment, thermal oxidation can then be carried out to form a selective growth mask layer 14 of silicon dioxide to a desired thickness. The thermal oxidation process consumes the substrate material, so that the thicker the silicon dioxide layer, the smaller the resulting width dimension of the final pedestal 12. Thus, the thickness of the silicon dioxide can be varied so that the diameter or width of the silicon pedestal 12 is reduced to any desired size dimension. Example width dimensions can be the same as those discussed above for FIG. 1. Alternatively, the pedestal 12 can be patterned to the desired final dimension during the etching step; followed by forming a selective growth mask layer to delineate the seed area by a process that does not consume the silicon to reduce the dimensions of the pedestal 12.

Figure 2D:
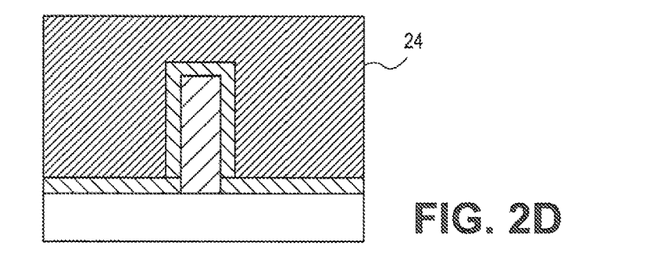

Referring to FIG. 2D, a non-conformal layer 24 is formed over the pedestal 12 and selective growth mask layer 14. Any suitable type of non-conformal layer can be employed. Examples of suitable non-conformal layers include doped silicon oxides, spin-on-glass, photoresist or other materials that can be deposited in liquid form, reflowed, polished or otherwise planarized to reduce surface topography. Suitable non-conformal layers are well known in the art.

Figure 2E:
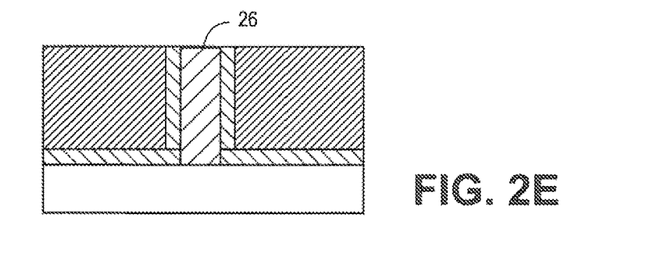

The non-conformal layer can be etched back until the selective growth mask layer 14 at the top of the pedestal 12 is exposed, as illustrated in FIG. 2E. The exposed portion of selective growth mask layer 14 can be removed by the same or a different etch process as is used to etch back the non-conformal layer 24. The remaining portion of the non-conformal layer 24 can then be removed if desired, such as where the non-conformal layer is a polymer.

Once exposed, the pedestal top surface can be used without further processing as a seed area for heteroepitaxial growth, if desired. During epitaxy, a single crystal semiconductor grows on the seed area 26 that is shown exposed in FIG. 2E.

Figure 2F:
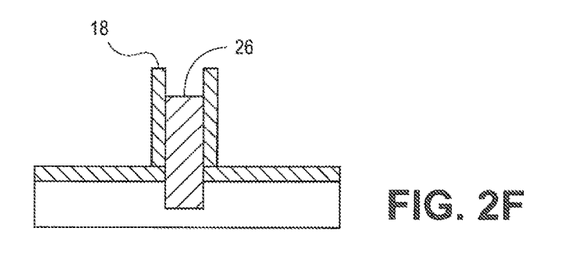
Figure 4:
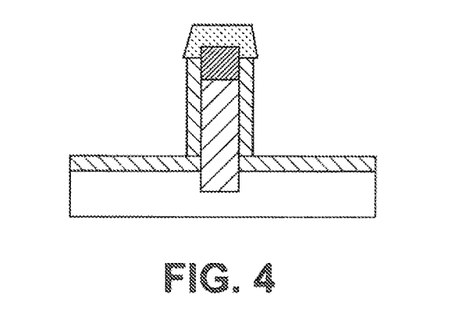
FIG. 4 illustrates a device structure comprising heteroepitaxially grown layers, according to an embodiment of the present disclosure.

Alternatively, a further selective etch back of the seed material of pedestal 12 can be carried out to form the sidewall barriers 18 prior to epitaxial growth, as illustrated in FIG. 2F. The etch back of the seed material can be performed by any suitable selective etch process, such as a dry etching process. Heteroepitaxial growth is then carried out between the sidewall barriers 18. Sidewall barriers 18 can block the propagation of defects, such as stacking faults and misfit dislocations, fro the upper region of the heteroepitaxial layer. The resulting structure is shown in FIG. 4, according to an embodiment of the present disclosure.

The epitaxy conditions, such as temperature and the ratio of precursor gases, can be controlled to allow for formation of a planar epitaxial layer surface. For example, a planar GaN(001) facet at the top of GaN epi-layer can be grown using appropriate growth conditions. One of ordinary skill in the art would be able to determine the desired conditions without undue experimentation.

The pedestal structures of the present disclosure can provide one or more of the following benefits: formation of heteroepitaxial materials with reduced defects; the selective growth mask layer 14 can prevent or reduce nucleation at the pedestal sidewalls, thereby isolating the nucleation during epitaxy to the top facet of the pedestal; pedestals can provide increased flexibility and/or the silicon pedestal structure can help relieve strain resulting from the lattice mismatch between the pedestal and the epitaxial material grown thereon.

Figure 5A:
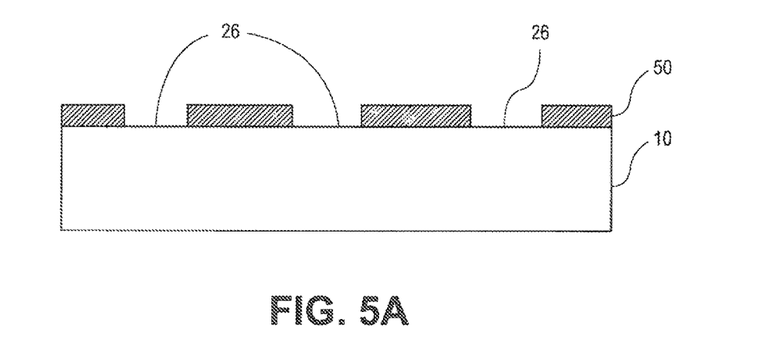
FIGS. 5A-5B illustrate a schematic view of growth mask directly on a 2D substrate surface, according to an embodiment of the present disclosure.
Figure 5B:
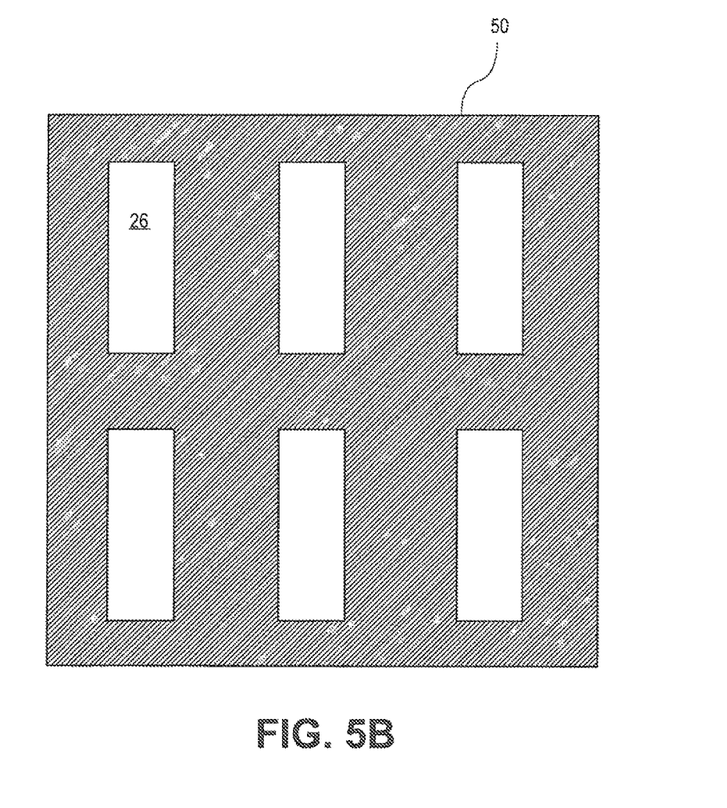

Still other embodiments are contemplated. FIGS. 5A and 5B illustrate a semiconductor substrate 10 comprising a surface masked with any suitable selective growth mask 50 for patterning the seed areas 26. The mask 50 can be relatively thin compared to the thickness of the subsequently formed and fully-grown heteroepitaxial layer that is formed on seed areas 26. A similar embodiment is contemplated that employs a thick growth mask 50 to prevent lateral overgrowth. Again, the term thick is relative to the thickness of the fully-grown heteroepitaxial layer subsequently grown on seed areas 26. Examples of suitable growth masks include $SiO_2$, $Si_3N_4$ or combinations thereof. The dimensions of the seed area can be any of the seed area dimensions described herein. In an embodiment, seed area dimensions in the substrate plane are ~10 nm wide by ~40 nm long. Similar dimensions can be employed for any of the seed areas illustrated in the embodiments of FIGS. 6-9.

Figure 6A:
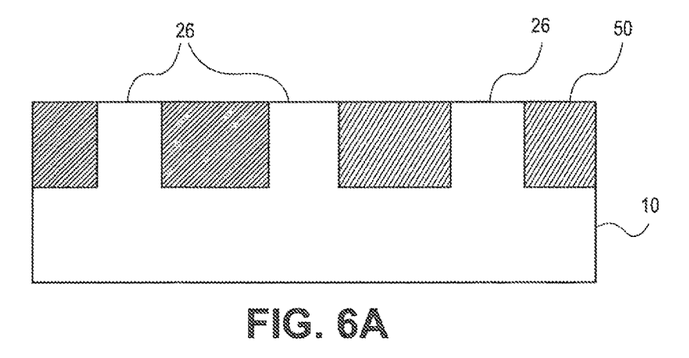
FIGS. 6A-6B illustrate a schematic view of growth mask flush with silicon pedestals, according to an embodiment of the present disclosure.
Figure 6B:
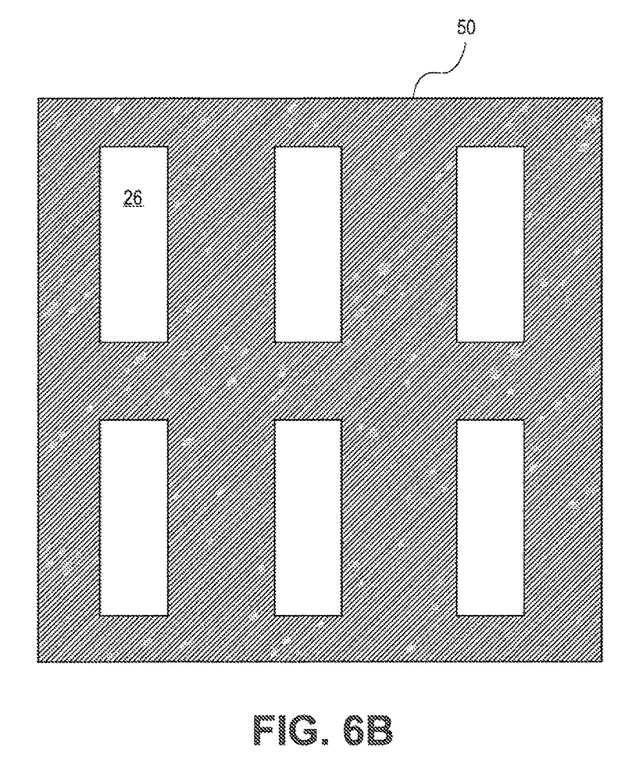

FIGS. 6A and 6B illustrate an embodiment comprising semiconductor pedestals, or plateaus, protruding from the substrate 10 to form the seed areas 26. Mask 50 can be any appropriate growth mask such as $SiO_2$, $Si_3N_4$ or combinations thereof, that is arranged to be more or less flush with the top surface of the seed areas 26.

Figure 7A:
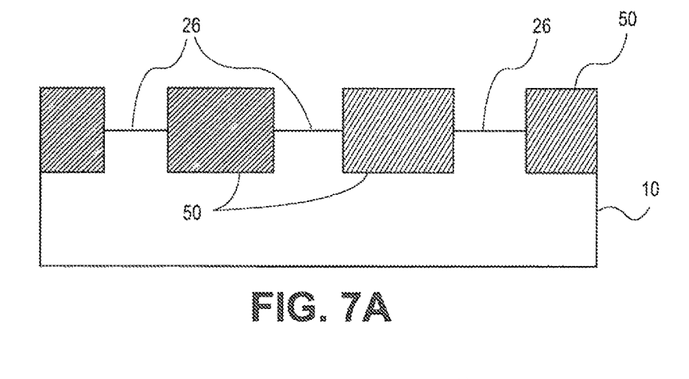
FIGS. 7A-7B illustrate a schematic view of a growth mask extending beyond silicon pedestals, according to an embodiment of the present disclosure.
Figure 7B:
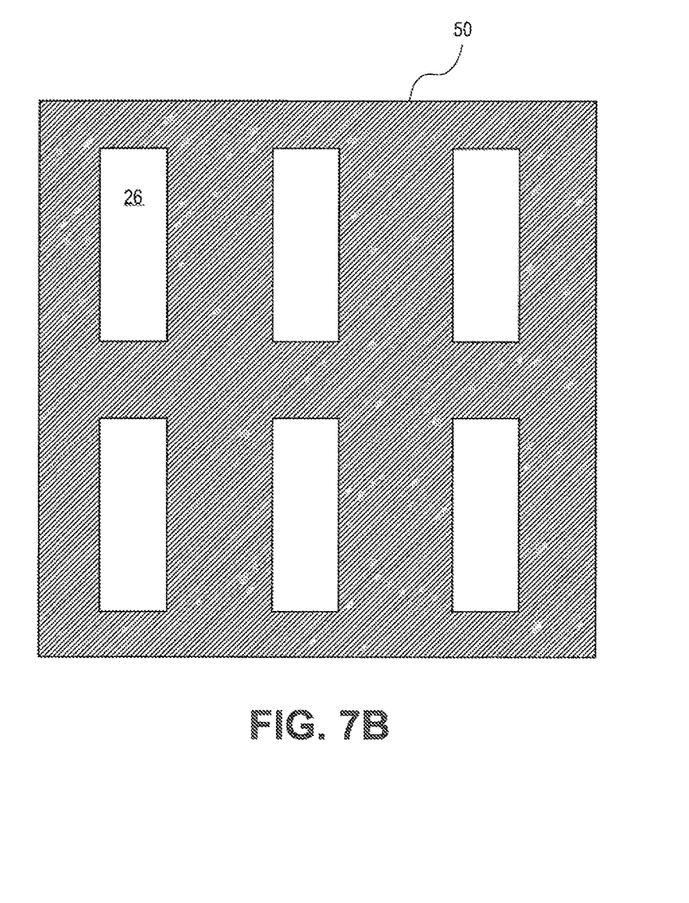

FIGS. 7A and 7B comprise semiconductor pedestals, or plateaus, protruding from the substrate 10 to form the seed areas 26 of the present disclosure, according to an embodiment of the present disclosure. Mask 50 is formed to be higher than the top of seed areas 26.

Figure 8A:
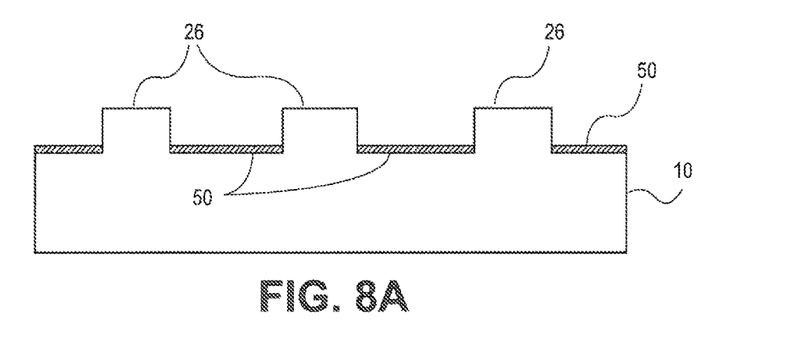
FIGS. 8A-8B illustrate a schematic view of silicon pedestals extending beyond growth mask, according to an embodiment of the present disclosure.
Figure 8B:
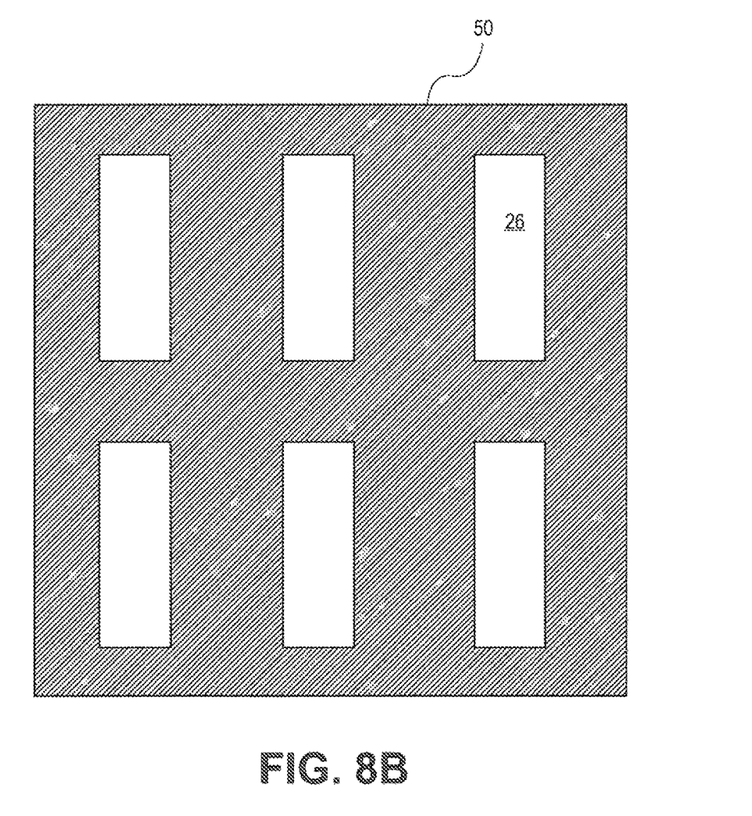
Figure 9A:
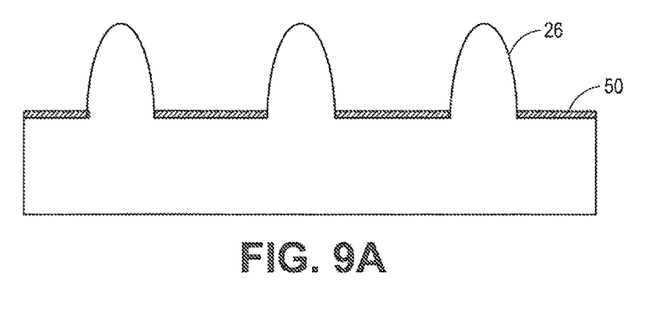
FIGS. 9A-9B illustrate a schematic view of non-faceted silicon pedestals extending beyond growth mask, according to an embodiment of the present disclosure.
Figure 9B:
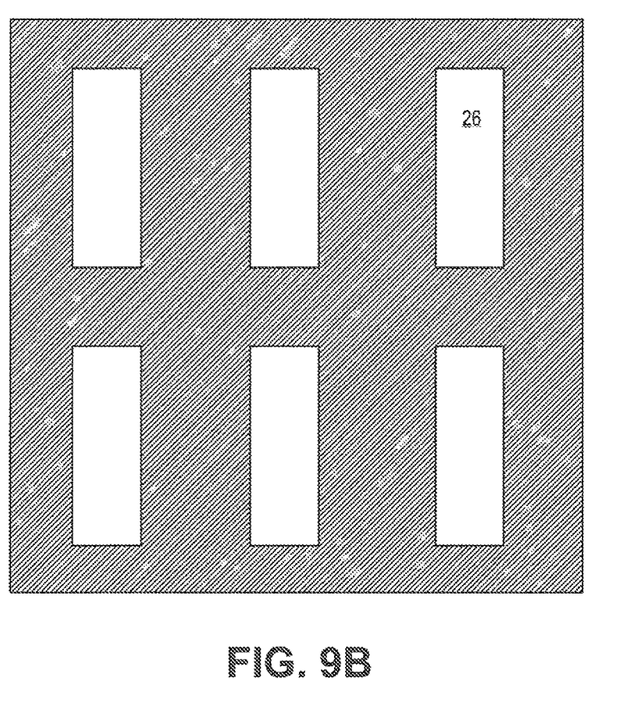

FIGS. 8A and 8B illustrate an alternative embodiment in which the growth mask 50 is lower than the top of seed areas 26, thereby allowing heteroepitaxial growth on the top and sides of the pedestals. FIGS. 9A and 9B illustrate an approach in which no faceted pedestals protrude from the substrate, according to an embodiment of the present disclosure. The mask 50 can be thinner than the top surface of seed areas 26, thereby allowing growth on the top and sides of the pedestals, similar to the embodiment illustrated in FIG. 8A. In any of the embodiments of FIGS. 5 to 9, the seed areas can comprise any of the semiconductor materials described for seed areas in the present disclosure: and the materials subsequently grown thereon can comprise any of the heteroepitaxial grown semiconductors described herein. Similarly, the mask 50 can be any of the mask materials described herein.

Figure 10:
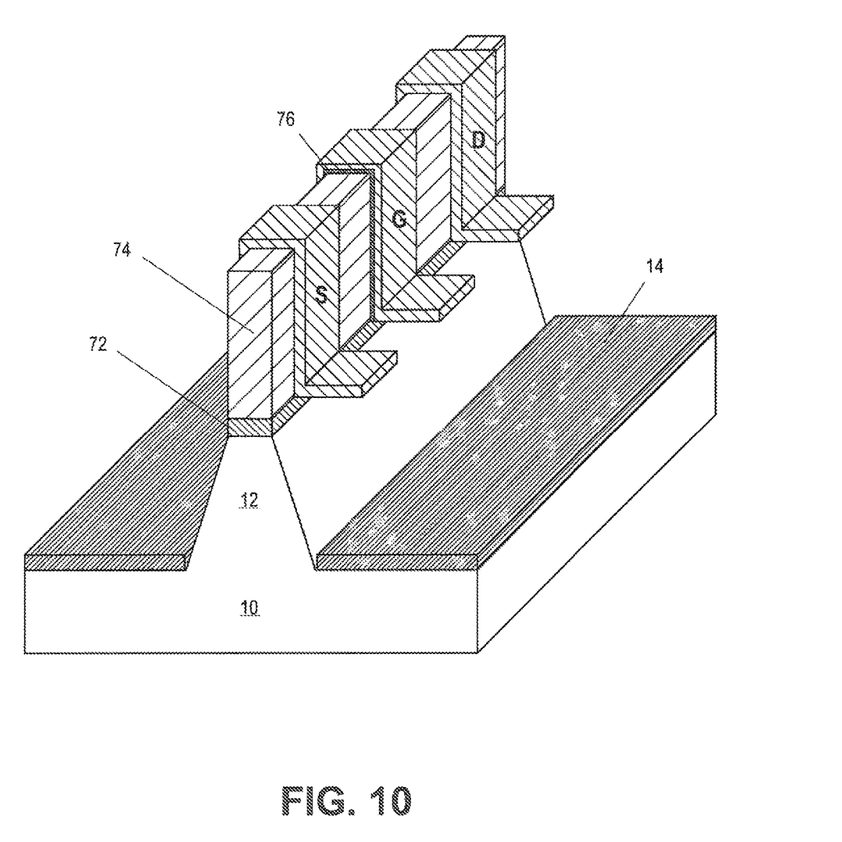
FIG. 10 illustrates an isometric projection of a heterostructure FinFET showing an isolation layer, the source, gate and drain contacts labeled S, G and D respectively, according to an embodiment of the present disclosure.

FIG. 10 illustrates an isometric projection of a FET device 70 that can be formed using heteroepitaxial layer structures, according to an embodiment of the present disclosure. Pedestal 12 can be formed using any suitable process, such as with a masking layer to prevent growth on the sidewalls of the pedestal. In an embodiment, a growth mask such as that shown in FIG. 7A can be used. The silicon pedestal 12 is shown with sloping sidewalls, but could have any other desired shape.

In an embodiment, heteroepitaxial growth proceeds from the exposed semiconductor surface, or seed area, of pedestal 12 The seed area surface can comprise any suitable material, including any seed area materials discussed herein. In an embodiment, the seed area surface is a Si(001) surface. An isolation layer 72 can be grown on the seed area. Isolation layer 72 can be, for example, a large bandgap material, to prevent leakage of carriers from the channel into the silicon. As noted above, isolation layer 72 can also be a layer, such as an $Al_{0.98}Ga_{0.02}As$ layer, that is easily oxidized following the growth to provide additional isolation. An alternative strategy is to dope the silicon so that it forms a p-n junction with the channel material, also reducing leakage of carriers into the silicon. Depending on the details of the bandgap alignment between the channel material and the silicon, isolation layer 72 may or may not be necessary.

In an embodiment, It is possible to grow a layer, such as but not restricted to, a high Al concentration AlGaAs layer, which can be selectively oxidized during the device processing subsequent to growth of the heteroepitaxial layer.

This allows epitaxial growth while at the same time providing the advantages of a semiconductor-on-oxide structure where the carriers are strongly confined to the channel. Additionally, the aluminum oxide layer can be selectively removed to provide access for a gate-all-around configuration. Examples of this technique are described in U.S. Provisional Patent Application 61/752,741, entitled Gate-All-Around Metal-Oxide-Semiconductor Transistors with Gate Oxides, filed Jan. 15, 2013, the disclosure of which is hereby incorporated herein by reference in its entirety.

Following the growth of the optional isolation layer, a channel layer 74 is grown. Channel layer 74 is a heteroepitaxial layer and can comprise any suitable materials discussed herein for heteroepitaxial growth. In an embodiment, the bandgap engineering that is common in III-V devices can be used in devices of the present disclosure to, for example, grow higher bandgap cladding layers below and above the active channel layer. This can shield the carriers in the channel from surface defects and reduces scattering and improves carrier mobilities, saturation velocities, and lifetimes.

In an embodiment, channel layer 74 can comprise several layers. For example, channel layer 74 can comprise a GaAs/InGaAs/GaAs structure in which the high mobility InGaAs material is clad with upper and lower high bandgap materials to shield the carriers from the higher point defect densities at the interface with the pedestal 12 or isolation layer and at the top surface of the growth.

Figure 12:
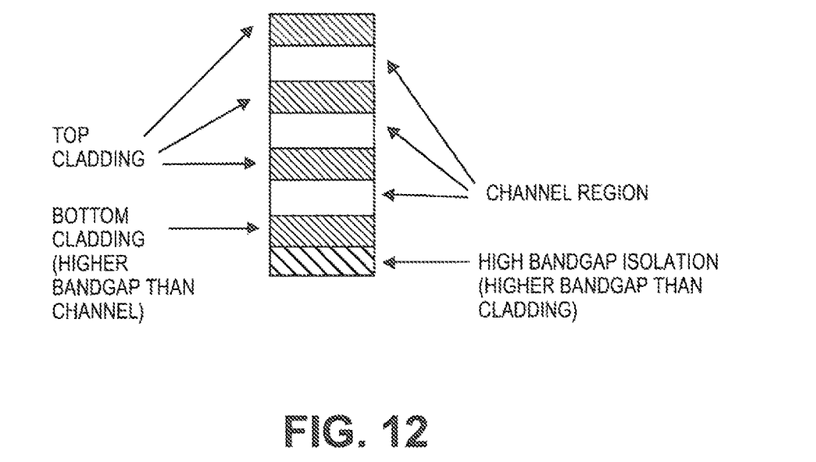
FIG. 12 illustrates a layered heterostructure for channel region of a device, according to an embodiment of the present disclosure.

FIG. 12 shows a possible layered heterostructure sequence for he channel layer 74, according to an embodiment of the present disclosure. This structure takes advantage of bandgap engineering that is well known for III-V devices, The structure comprises a bottom large bandgap material in contact with a pedestal 12. A bottom cladding functions to keep carriers away from the interface with pedestal 12. A channel region and a top cladding are formed over the bottom cladding. As is well known in the art, the channel region and top cladding can optionally be repeated a number of times, as shown, to provide increased current carrying capacity if thin channel regions, such as quantum wells, are desired.

Following the heterospitaxial growth step of channel layer 74, doping of the source and drain regions can be carried out. This can include a masked ion implantation followed by an annealing step to activate the impurities. This will modify the growth layers by impurity induced diffusion to lower the resistance of the source-gate-drain transitions. A gate dielectric 76 and source "S", drain "D" and gate "G" electrodes, as illustrated in FIG. 10, can be formed by any suitable methods. Suitable methods are known in the art. The gate dielectric 76 and gate electrode together form a gate of the transistor, as is generally well known in the art.

Figure 11:
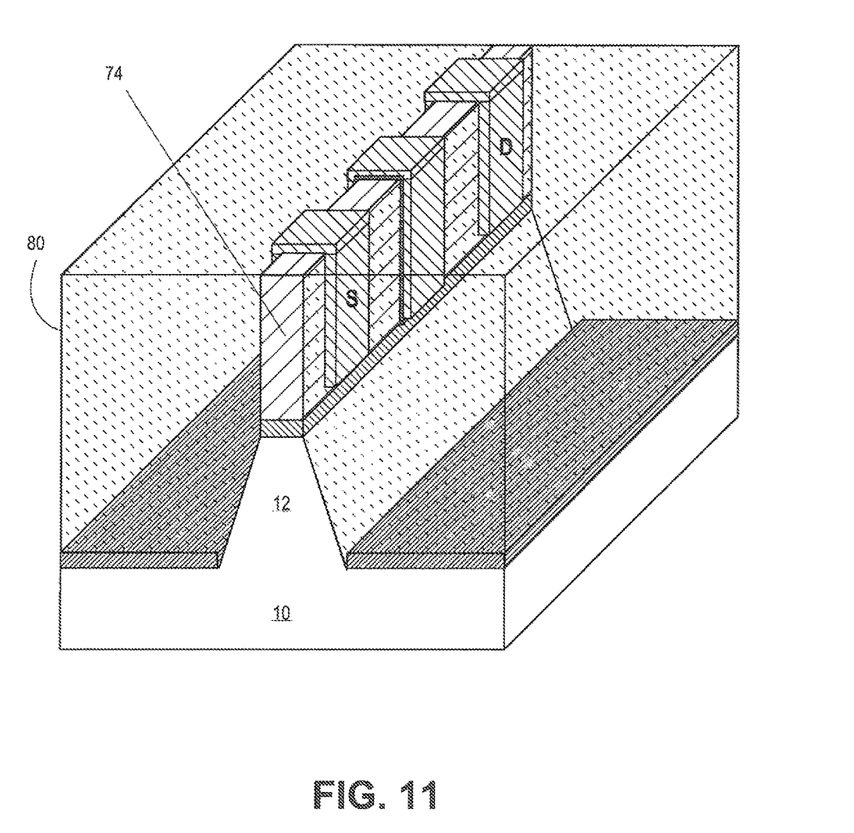
FIG. 11 illustrates an isometric projection of a heterostructure FinFET with a dielectric isolation (shown as semitransparent for clarity), according to an embodiment of the present disclosure.

FIG. 11 shows an embodiment where a dielectric spacer 80 is used to planarize the structure following the S/G/D metallization. This layer can be thicker than the finFET and contact holes can be created for contacting the S/G/D, as is well known in the art.

Another geometry of interest s a vertical channel. This embodiment lends itself to a gate all around configuration and has the significant advantage that the gate is self-aligned to the nanowires. The gate length can be set by deposition processes which are much more controllable than lithography at nm dimensions. Examples of vertical MOSFETS are described in U.S. Pat. No. 8,344,361, the disclosure of which is hereby incorporated by reference in its entirety. The '361 patent does not explicitly discuss heterostructure growth from a silicon substrate, and is primarily about forming two and three terminal devices.

Figure 13:
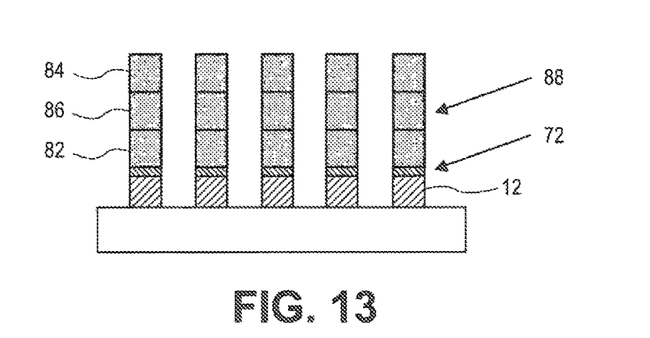
FIGS. 13-14 illustrate schematic views of vertical nanowire transistors grown seed areas, according to an embodiment of the present disclosure.
Figure 14:
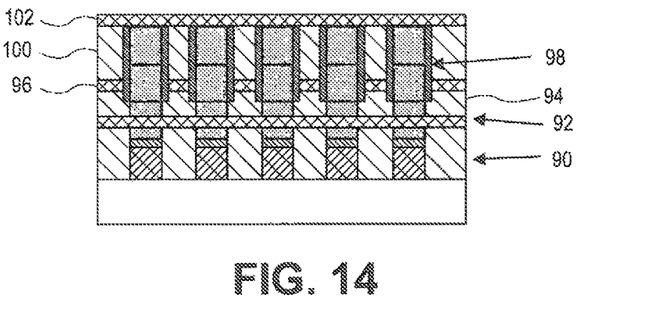

FIGS. 13 and 14 illustrate a process for forming high mobility channel vertical transistors based on nanowire growth from nanoscale Si seeds. The seed area can have a linear surface dimension of 100 nm or less, such as 20 or 25 nm or less, or about 10 nm. For specificity, the concept proceeds in a source down configuration. However, the alternative drain down configuration is also available, as would be understood by one of ordinary skill in the art.

As shown, the heteroepitaxial growth starts from Si(001) pedestals 12 that can have any desired shape, such as square or round cross-sections, or extended into walls (e.g., a length dimension that is many times larger than the width dimension, such as 5, 10 or 100 times or more). An optional isolation layer 72 is first grown to isolate the source from the Si material, Since the source region 82 is adjacent to the silicon in a source down embodiment, and a good contact can be provided, leakage into the silicon is not as important to the device performance as it was for the horizontal devices where the gate region was in direct contact with the silicon substrate material. Doping can be varied during the epitaxial growth to provide heavy doping in the source and drain regions 82, 84 and reduced doping in the gate region 86.

The de-lineation of the source/gate/drain regions of the nanowires refers to doping levels during the growth. The vertical devices are shown in parallel, e.g. all source, gate and drain contacts are connected to the same metallization. In an actual circuit, only some of the devices will be connected in parallel to provide current carrying capability; other devices would form the channels of different transistors in accordance with the circuit design.

Following the growth of the nanowire 88, a dielectric layer 90 is provided to isolate the silicon followed by formation of the source contact layer 92. Appropriate annealing processes can be employed to assure good contact to the source regions of the nanowires. While all of the sources are shown connected in parallel; in practice, one or more of the nanowires will be in parallel to provide current carrying capability and others will be incorporated into different transistors as dictated by the circuit design.

Following formation of the source contact 92, a field dielectric layer 94 can be deposited to isolate the gate contact 96 from the source contact 92. Initially, the field dielectric layer 94 can stop just short of the gate region to allow for oxidation of the nanowire to provide the gate dielectric 98. The field dielectric 94 can then be continued to the middle of the gate region and gate contact 96 is provided.

Following formation of gate contact 96, additional field dielectric 100 can be deposited on top of the gate contact to completely cover the nanowires 88. Then an etch back step can be carried out to expose the top of the drain regions and a drain contact 102 is provided. Additional processing can be used to define the various transistors and interconnections, as is the case in traditional integrated circuit manufacturing. There can be many variants on this basic process. For example, the gate oxide layer can be removed from the sidewall of the drain region and contact made using this sidewall in place of the top contact shown.

Using methods of the present disclosure, growth of the channels and the source and drain regions of transistor structures can be carried out simultaneously. An advantage is that the transitions between the source, channel and drain regions are single crystal material thereby providing high-quality, low-resistance transitions. Threading dislocations in the source/drain regions are relatively benign since these are less critical heavily doped regions, where the electrical impact of the dislocation is reduced by screen associate with the high concentration of carriers. This is true for both horizontal and vertical geometries.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one f save implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A device comprising:
   a semiconductor substrate comprising single crystal silicon;
   a seed area delineated with a selective growth mask on the semiconductor substrate, the seed area comprising a first material and having a linear surface dimension of less than 100 nm;
   a heteroepitaxial layer grown on the seed area, the heteroepitaxial layer comprising a second material that is different from the first material, a source region and a drain region; and
   a gate, a source electrode and a drain electrode positioned on the heteroepitaxial layer to form a FinFET,
   wherein the seed area comprises Si (001) and the heteroepitaxial layer comprises a material chosen from a Group III-N semiconductor material, wherein the heteroepitaxial layer forms the fin of the FinFET, and further wherein there are substantially zero threading dislocation defects in the heteroepitaxial layer.

2. The device of claim 1, wherein the linear surface dimension is less than 25 nm.

3. The device of claim 1, wherein the seed area is raised from the semiconductor substrate surface to form a pedestal.

4. The device of claim 1, wherein the seed area is formed planar with the surface of the semiconductor substrate.

5. A device comprising:
   a semiconductor substrate;
   a seed area delineated with a selective growth mask on the semiconductor substrate, the seed area comprising a first material and having a linear surface dimension of less than 100 nm; and
   a heteroepitaxial layer grown on the seed area, the heteroepitaxial layer comprising a second material that is different from the first material,
   wherein the heteroepitaxial layer is a vertical nanowire, the vertical nanowire being doped to provide a source region, a drain region and a gate region, the device forming a vertical transistor.

* * * * *